(12) United States Patent
Yuan

(10) Patent No.: US 6,297,515 B1
(45) Date of Patent: Oct. 2, 2001

(54) INTEGRATED ACOUSTIC THIN FILM RESONATOR

(75) Inventor: Han-Tzong Yuan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/393,777

(22) Filed: Sep. 10, 1999

Related U.S. Application Data

(60) Provisional application No. 60/099,864, filed on Sep. 11, 1998.

(51) Int. Cl.$^7$ .............................. H01L 29/78; H01L 33/00
(52) U.S. Cl. ................................ 257/9; 257/14; 333/187
(58) Field of Search .......................... 257/9, 14; 333/187

(56) References Cited

U.S. PATENT DOCUMENTS

| | | |
|---|---|---|
| 5,367,308 | * 11/1994 | Weber . |
| 5,821,833 | * 10/1998 | Lakin . |
| 5,864,261 | * 1/1999 | Weber . |
| 5,936,150 | * 8/1999 | Kobrin et al. . |
| 6,107,721 | * 8/2000 | Lakin . |
| 6,114,635 | * 9/2000 | Lakin et al. . |

* cited by examiner

Primary Examiner—Stephen D. Meier
(74) Attorney, Agent, or Firm—Carlton H. Hoel; Wade James Brady, III; Frederick J. Telecky, Jr.

(57) ABSTRACT

An resonator circuit and an integrated circuit including the resonator circuit and method of making. A silicon substrate of a first conductivity type (1) is provided and an integrated circuit TFR circuit (23) is formed on a region of the substrate which includes a stack containing a plurality of alternately non-porous (3,7,11) silicon and porous (5,9,13) silicon layers. A method is provided to deposit layers with alternately opposite conductivity type and convert only one conductivity type but not the other into porous silicon materials. Each of these layers generally has the thickness which is one quarter of an acoutic wavelength of the resonator frequency. A noise isolator (17,19) is disposed along the sidewalls of the stack and extends into the substrate. A region of silicon (29) is disposed on the substrate and separated from the reflector by the noise isolator. At least one of an active and/or passive device (27) is disposed on or in said region of silicon. There can additionally or alternatively be at least one passive device disposed over the noise isolator (25) with an interconnect (21) interconnecting the resonator and the at least one of an active and/or passive device and the at least one passive device. The noise isolator can completely surrounds the stack. The noise isolator is preferably porous silicon.

19 Claims, 1 Drawing Sheet

US 6,297,515 B1

INTEGRATED ACOUSTIC THIN FILM RESONATOR

This application claims benefit of Provisional No. 60/099,864 filed Sep. 11, 1998.

BACKGROUND OF THE INVENTION

1. Field of the Invention

This invention relates to an integrated circuit having a reflector for an acoustic thin film resonator as a portion of the integrated circuit and a method of fabricating the integrated circuit with the reflector and resonator.

2. Brief Description of the Prior Art

High-Q resonators are key components for radio frequency (RF) wireless communication equipment. Resonators are required for filter construction and for production of stable oscillators. A number of materials, such as piezoelectric, high dielectric and surface acoustic wave (SAW) can be used to build high-Q resonators. However, these materials are generally not compatible with silicon semiconductor processing techniques and therefore cannot be integrated into silicon integrated circuit fabrication processes. Recently, several thin film acoustic resonators (TFR) were examined as candidates for integrated resonators as referenced by K M. Lakin et al., "Stacked Crystal Filters Implemented With Thin Films", 43rd Annual Symposium on Frequency Control, (1989) and C. W. Seabury et al., "Thin Film ZnO Based Bulk Acoustic Mode Filters", 1997 IEEE MTT-5 Digest. These designs demonstrated the size advantages and the Q-factor suitable for silicon integration. However, these designs also required additional non-planar processing, such as, for example, a deep silicon etch to create an air gap under the resonator structure or use of a high stack of quarter wave reflectors to isolate the thin film acoustic resonators. Accordingly, these designs are not suitable candidates for use in conjunction with an integrated circuit fabrication process.

SUMMARY OF THE INVENTION

In accordance with the present invention, there is provided an integrated circuit formed of silicon and piezoelectric materials which includes therein active and/or passive elements as well as TFRs using a porous silicon (ps)/silicon (s) acoustic quarter wave reflector that has a planar structure which is integrated into the silicon integrated circuit fabrication process. It has been found that porous silicon has a different acoustic impedance from to non-porous bulk silicon with a reduced impedance proportional to increased silicon porosity, apparently due to the air content of the pores. For example, porous silicon having 60 percent porosity or 40 percent of the density of bulk silicon was measured to have about one fourth the acoustic impedance of the bulk silicon. The porosity range for the porous silicon can be made to vary from about 30 percent to about 70 percent. This difference in acoustic impedance was exploited to quarter wave reflector design for an integrated TFR.

In order to fabricate such a reflector onto an integrated circuit in accordance with the present invention, starting with a silicon substrate of a first conductivity type, for example P+, a stack of multiple silicon layers with alternating N− and P+ dopants are deposited on the substrate. Next, a P+ diffusion is applied, preferably surrounding the region chosen for the resonator fabrication. A subsequent standard anodization process converts the P+ but not the N− layers surrounded by the P+ diffusion into porous silicon, thus it turns the silicon stack into an acoustic reflector structure. Selected P+ diffusion regions of predetermined size can also be converted into thick porous silicon retion at the same time to provide noise isolation for passive components integration. The layer thicknesses of the multiple silicon stack are precalculated by the sound velocity measured in porous silicon and bulk silicon to provide a desired quarter wave acoustic reflector. The number of layers is determined by the final acoustic impedance requirement which is calculated, layer by layer using the $\lambda/4$ impedance transformer equation $Z_o = (Z_{in} Z_{out})^{1/2}$ where $Z_o$ relates to non-porous silicon or porous silicon at each successive layer. These layers can be deposited by standard epitaxial deposition techniques with the porous layers being formed, for example, in accordance with known prior art techniques of the type described, for example, in Ser. No. 60/068,922, filed Dec. 29, 1997 (TI-23664) and in an article entitled "The 'Islands' Method-A Manufacturable Porous Silicon SOI Technology" of E. J. Zorinsky et al., IEDM 86-431, 1986 IEEE, the contents of all of which are incorporated herein by reference. All active and/or passive devices including metallization for interconnects are subsequently formed in or on the substrate in standard manner and spaced from the stack other than required connections to the stack. Some or all of the passive elements can be formed over the selected porous silicon region. Alternatively, the surrounding region can be formed along with the opposite conductivity region and subsequently masked and anodized to form porous silicon in the surrounding region in accordance with known prior art techniques of the type described in the above cited copending application and article. The process then proceeds to form the resonator, such as, for example, by depositing zinc oxide, aluminum nitride, etc., in standard manner over the reflector. Since the reflector is built into silicon, there is provided a relatively planar integrated circuit structure. Also, since the resonator is disposed over the silicon structure, it will have a solid physical support, unlike air gap isolated resonators, to maintain the device integrity for package and assembly.

DESCRIPTION OF THE PREFERRED EMBODIMENT

Figure 1:
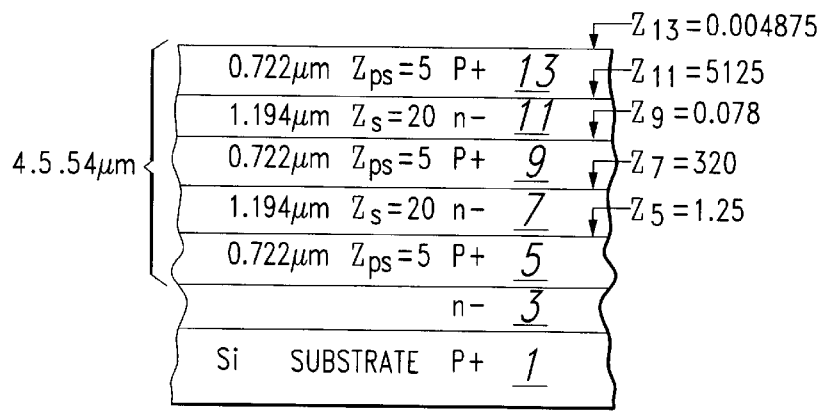
FIG. 1 is a schematic diagram of a typical six layer reflector built in accordance with the present invention.

Referring to FIG. 1, there is shown a typical six layer reflector with a nearly short circuit or low impedance termination to the TFR. This can be fabricated for use in accordance with the present invention. There is shown a p+ silicon substrate 1 over which has been deposited a first n− layer 3 over which are successive layers 5, 7, 9, 11 and 13 which are alternate layers of p+ and n− silicon, the p+ layer being converted later to porous silicon and the n− layer being preserved as non-porous silicon. In the 1.8 GHz design example of FIG. 1, the porous silicon layers have a $\lambda/4$ thickness of 0.722 $\mu$m and a characteristic impedance of $5 \times 10^6$ kg/m$^2$s and the n− layers have a $\lambda/4$ thickness of 1.194 $\mu$m and a characteristic impedance of $20 \times 10^6$ kg/m$^2$s. The input acoustic impedance $Z_{5, 11, 13}$ looking into each porous silicon layer is calculated by the familiar $\lambda/4$ transformer equation: $Z_o=(Z_{in}Z_{out})^{1/2}$ where $Z_{in}$ refers to input impedance and $Z_{out}$ refers to output impedance and $Z_o$ refers to characteristic impedance used as $\lambda/4$ transformer. Accordingly, the reflection coefficient at the ZnO (with acoustic impedance $36 \times 10^6$ Kg/m$^2$s) and the last porous silicon layer 13 (with input impedance 0.004875 Kg/m$^2$S) in FIG. 1 is $(Z_{zno}-Z_{13})/(Z_{zno}+Z_{13})$ or $(36-0.004875)/(36+0.004875)=0.99973$ or $-0.001$ dB reflection loss. This is adequate to fabricate a Q up to 1000 TFR structure.

Figure 2:
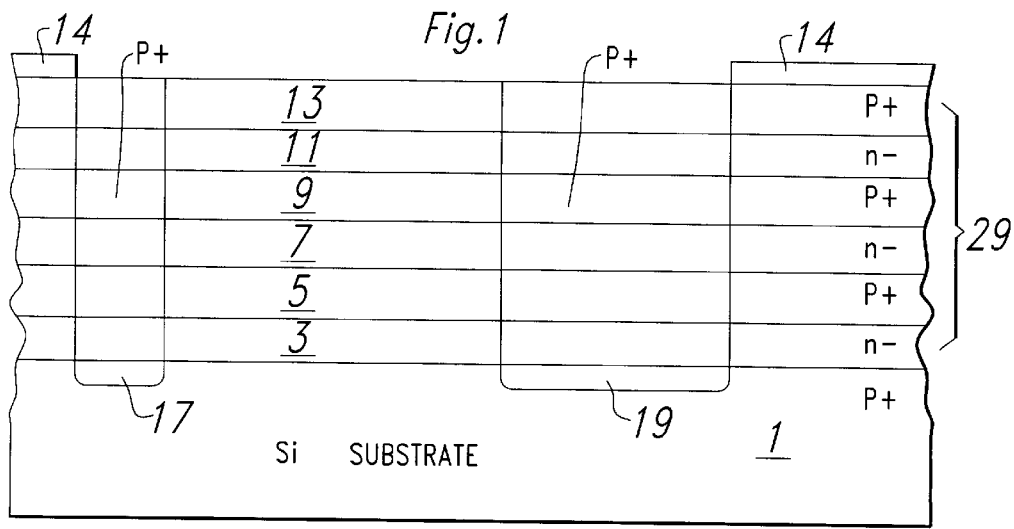
FIG. 2 is a schematic diagram of P+ diffusion and masking prior to anodization to convert P+ layers and P+ diffusion into porous silicon.
Figure 3:
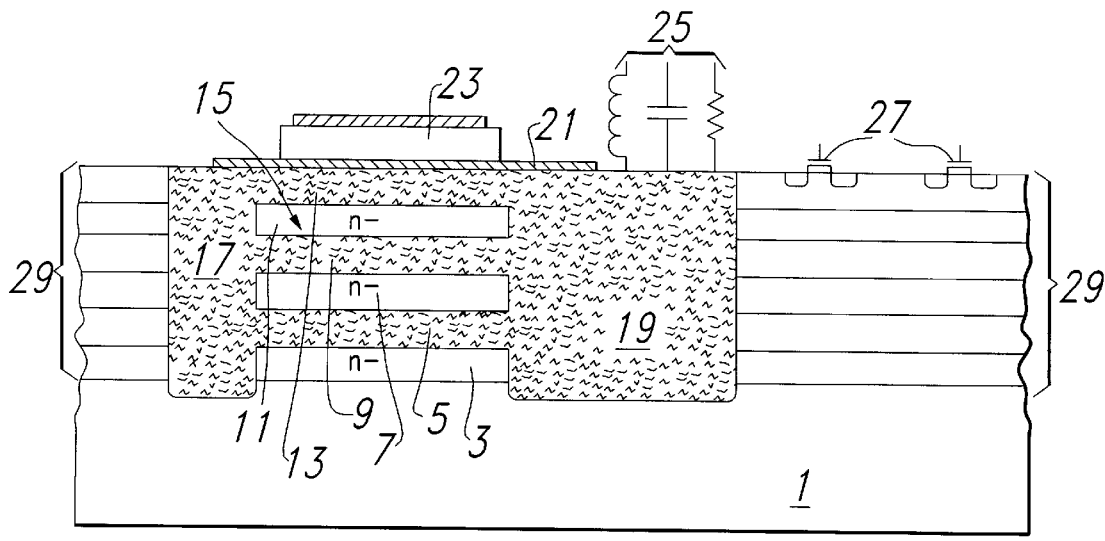
FIG. 3 is a schematic diagram of a typical integrated circuit containing a reflector and a resonator in accordance with the present invention.

Referring to FIG. 2, there is shown a schematic diagram of the P+ diffusion and masking required prior to anodization to convert the P+ layers into porous silicon whereas the N− layers and not so converted to provide a structure of the type shown in FIG. 3. There is provide the P+ silicon substrate 1 over which have been formed alternating N− layers 3, 7, 11 interleaved with P+ layers 5, 9, 13. The structure is then masked, leaving only the surrounding regions 17,19 exposed and sufficient P-type dopant is implanted/diffused and to a sufficient depth such that all unmasked portions of N− layers 3, 7, 11 are converted to P+ and the dopant extends partly into the substrate 1. The mask is then removed and the structure is again masked with an appropriate mask 14 which exposes the surrounding regions 17,19 and the layered structure surrounding by the surrounding regions. When anodization now takes place, only the exposed parts of the P+ layers and the surrounding regions 17,19 are made porous with the N− regions and the regions under the mask 14, numbered 29 in FIG. 3, remain intact.

Referring to FIG. 3, there is shown an integrated circuit in accordance with the present invention having a TFR with an integrated acoustic reflector design. The circuit includes the substrate 1 of FIG. 1 and the reflector as shown by the alternate layers 3, 5, 7, 9, 11 and 13 which are the same as in FIG. 1 to form the reflector 15. The reflector 15 is surrounded by p+ diffusion to substrate connection regions which are converted to porous silicon 17, 19 together with layers 5, 9 and 13. The substrate connection region 17, 19 can have varying widths around the acoustic reflector, or defined as a separate region to facilitate RLC passive integration 25. A region of interconnect 21 is disposed over the reflector 15 and extends over the surrounding region 19, this interconnect, for example, coupling a piezoelectric resonator 23, disposed over the reflector and formed from, for example, zinc oxide or aluminum nitride to passive circuit elements 25 disposed over the surrounding region 19. Also shown are active elements 27 which are formed in standard manner in the n− region 29 which is formed over the substrate 1 and external to the surrounding region 17, 19. Connection among the various elements shown is by standard interconnect.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. An integrated circuit resonator circuit which comprises:
   (a) a silicon substrate of a first conductivity type;
   (b) a stack containing a plurality of alternately non-porous silicon and porous silicon layers and of alternately opposite conductivity type and said first conductivity type disposed over a portion of said substrate; and
   (c) a TFR resonator disposed over said stack.

2. The circuit of claim 1 further including a noise isolator disposed along the sidewalls of said stack and extending into said substrate.

3. The circuit of claim 2 wherein said noise isolator completely surrounds said stack.

4. The circuit of claim 2 wherein said noise isolator is porous silicon.

5. The circuit of claim 3 wherein said noise isolator is porous silicon.

6. The circuit of claim 1 wherein said layers of said stack have a thickness of one quarter of the wave length of frequency of said resonator.

7. The circuit of claim 5 wherein said layers of said stack have a thickness of one quarter of the wave length of frequency of said resonator.

8. An integrated circuit which comprises:
   (a) a silicon substrate of a first conductivity type;
   (b) an integrated circuit resonator circuit which includes:
      (i) a stack containing a plurality of alternately non-porous silicon and porous silicon layers and of alternately opposite conductivity type and said first conductivity type disposed over a portion of said substrate; and
      (iii) a TFR resonator disposed over said stack;
   (c) a noise isolator disposed along the sidewalls of said stack and extending into said substrate;
   (d) a region of silicon disposed on said substrate and separated from said reflector by said noise isolator; and
   (e) at least one of an active and/or passive device disposed on or in said region of silicon.

9. The circuit of claim 8 further including at least one passive device disposed over said noise isolator.

10. The circuit of claim 8 further including an interconnect interconnecting said resonator and said at least one of an active and/or passive device.

11. The circuit of claim 9 further including an interconnect interconnecting said resonator and at least one of said at least one of an active and/or passive device and said at least one passive device.

12. The circuit of claim 8 wherein said noise isolator completely surrounds said stack.

13. The circuit of claim 9 wherein said noise isolator completely surrounds said stack.

14. The circuit of claim 10 wherein said noise isolator completely surrounds said stack.

15. The circuit of claim 11 wherein said noise isolator completely surrounds said stack.

16. The circuit of claim 8 wherein said noise isolator is porous silicon.

17. The circuit of claim 15 wherein said noise isolator is porous silicon.

18. The circuit of claim 8 wherein said layers of said stack have a thickness of one quarter of the wave length of frequency of said resonator.

19. The circuit of claim 17 wherein said layers of said stack have a thickness of one quarter of the wave length of frequency of said resonator.

* * * * *